United States Patent
Hoang et al.

(10) Patent No.: US 7,378,733 B1
(45) Date of Patent: May 27, 2008

(54) COMPOSITE FLIP-CHIP PACKAGE WITH ENCASED COMPONENTS AND METHOD OF FABRICATING SAME

(75) Inventors: Lan H. Hoang, Fremont, CA (US); Paul Ying-Fung Wu, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/511,969

(22) Filed: Aug. 29, 2006

(51) Int. Cl.
*H01L 23/34* (2006.01)
(52) U.S. Cl. .............. 257/724; 257/778; 257/E23.178
(58) Field of Classification Search ............... 257/686, 257/723–724, 777–778, E23.178
See application file for complete search history.

(56) References Cited

U.S. PATENT DOCUMENTS

| | | | |
|---|---|---|---|
| 5,222,014 A * | 6/1993 | Lin | 361/792 |
| 6,319,829 B1 | 11/2001 | Pasco et al. | |
| 6,618,938 B1 | 9/2003 | Alagaratnam et al. | |
| 6,734,552 B2 * | 5/2004 | Combs et al. | 257/707 |
| 6,970,362 B1 | 11/2005 | Chakravorty | |
| 6,979,895 B2 * | 12/2005 | Akram et al. | 257/686 |
| 2006/0158863 A1 * | 7/2006 | Hsu | 361/760 |

OTHER PUBLICATIONS

Xilinx, Inc.; U.S. Appl. No. 11/511,969 by Hoang et al. on Aug. 29, 2006.
U.S. Appl. No. 11/511,833, filed Aug. 29, 2006, Wu et al.
U.S. Appl. No. 12/028,434, filed Feb. 8, 2008, Wu et al.

* cited by examiner

*Primary Examiner*—Hoai v Pham
(74) *Attorney, Agent, or Firm*—Robert Brush

(57) ABSTRACT

Composite flip-chip with encased components and method of fabricating the same is described. One aspect of the invention relates to fabricating composite flip-chip packages for integrated circuit dice. Interposing substrates are formed. At least one discrete component is attached to a bottom surface of each of the interposing substrates. A first array of solder balls is placed on the bottom surface of each of the interposing substrates. The interposing substrates are mounted to a carrier strip. The integrated circuit dice are attached to top surfaces of the interposing substrates. The integrated circuit dice and the interposing substrates are encapsulated in molding compound to define flip-chip assemblies.

11 Claims, 7 Drawing Sheets

COMPOSITE FLIP-CHIP PACKAGE WITH ENCASED COMPONENTS AND METHOD OF FABRICATING SAME

FIELD OF THE INVENTION

One or more aspects of the present invention relate generally to integrated circuit (IC) packaging and, more particularly, to a composite flip-chip package with encased components and a method of fabricating the same.

BACKGROUND OF THE INVENTION

As integrated circuits have become more complex employing more and more pins in a limited area, and more input/output (I/O) signal pins are switching at high speed at the same time, decoupling the power supplies through efficient usage of low inductance capacitors is essential. Current techniques for incorporating decoupling capacitors include: i) placing discrete capacitors coplanar to the integrated circuit (IC) die on the top surface of the substrate; and ii) placing discrete capacitors onto the underside of the package, coplanar to the BGA balls.

The first approach, of placing discrete capacitors coplanar to the IC die, is cost effective, but suffers from the following drawbacks: a) the effective inductance of the decoupling network ranges around 400 pH to 600 pH, due to the cumulative effect of the horizontal/lateral spreading inductance of the power plane between the power bump locations in the IC die and the capacitor location, the inductance contributed by the vias, and the ESL (Equivalent Series Inductance) of the capacitor; b) the placement of capacitors and the feasible quantity of capacitors are very constrained, due to die-to-capacitor keep-out and capacitor to package-edge keepout rules; c) the capacitors interfere with signal routing as the mounting pads for the capacitors act as obstacles to the routing paths; d) capacitors obstruct the placement and attachment of the lid by limiting the amount of area available for the lid to contact the substrate, potentially causing lid separation in field usage due to poor adhesion; and e) in some IC die and package size combination, there is not enough real estate for placing any capacitors.

The second approach, of placing discrete capacitors onto the under side of the package, either vertically direct below the IC die bump location or nearby, allows for reasonably low inductance decoupling at around 100 pH by careful design, exhibits certain deficiencies: a) for each capacitor that is placed, two or more pin locations of the package need to be depopulated (that is, removed from communicating between the package and the PCB); b) the power bump locations on the die dictate where the capacitor and pin depopulation should be, which renders pinout sharing among differently sized dice impractical; and c) in applications where a high number of capacitors or other useful passive and/or active components are required, the pin depopulation constricts the available number of pins available for a designated package size. This could also limit the pinout pattern design and prevent implementation of a high performance pinout pattern.

Accordingly, there is a need for a flip chip package with integrated capacitors that is low-inductance capable, with high capacity in both unit count and capacitance, with design flexibility, constraint-free pinout, allowing multiple passive or active component types.

SUMMARY OF THE INVENTION

Composite flip-chip with encased components and method of fabricating the same is described. One aspect of the invention relates to an assembly having an integrated circuit die, a carrier substrate, an interposing substrate, and at least one discrete circuit component. The integrated circuit die includes an array of bump contacts. An array of solder balls is disposed on a top surface of the carrier substrate. The interposing substrate is disposed between the integrated circuit and the carrier substrate. The interposing substrate includes a top surface mounted to the array of bump contacts and a bottom surface mounted to the array of solder balls. The discrete components are disposed between the interposing substrate and the carrier substrate. Each of the discrete components is surface mounted to the bottom surface of the interposing substrate among the array of solder balls. Molding compound encapsulates the integrated circuit die, the interposing substrate, and the discrete component(s).

Another aspect of the invention relates to fabricating composite flip-chip packages for integrated circuit dice. Interposing substrates are formed. At least one discrete component is attached to a bottom surface of each of the interposing substrates. A first array of solder balls is placed on the bottom surface of each of the interposing substrates. The interposing substrates are mounted to a carrier strip. The integrated circuit dice are attached to top surfaces of the interposing substrates. The integrated circuit dice and the interposing substrates are encapsulated in molding compound to define flip-chip assemblies.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
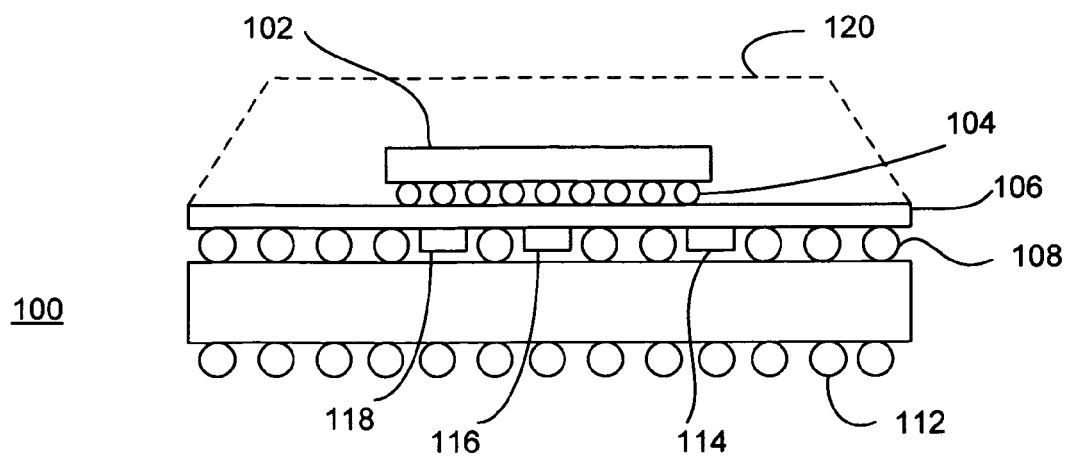
FIG. 1 is a cross-sectional view of a semiconductor device in accordance with one or more aspects of the invention.

FIG. 1 is a cross-sectional view of a semiconductor device 100 in accordance with one or more aspects of the invention.

The semiconductor device 100 includes a die 102, an interposing substrate 106, and a carrier substrate 110. The die 102 includes circuitry formed on a semiconductor substrate (not shown). The die 102 also includes an array of bump contacts 104 disposed on a planar surface. In one embodiment, the planar surface is the face side of the die 102. The term "face side" denotes the side of the die 102 that receives the bulk of semiconductor processing such that circuitry is fabricated on that face side of the die 102. The die 102 is mounted face-side down on a top surface of the interposing substrate 106 in a flip-chip manner. The bump contacts 104 are registered with matching conductive lands (shown below) patterned on the top surface of the interposing substrate 106 and then the bump contacts 104 are reflowed to form solder joints. The solder joints provide an electrical and mechanical connection between the die 102 and the interposing substrate 106. This technique for mounting the die 102 on the interposing substrate 104 is known as controlled collapse chip connect (C4).

The interposing substrate 106 is disposed between the die 102 and the carrier substrate 110. The interposing substrate 106 is mechanically and electrically coupled to the carrier substrate 110 by an array of solder balls 108. The solder balls 108 electrically and mechanically couple conductive lands patterned on the bottom surface of the interposing substrate 106 and matching conductive lands patterned on the top surface of the carrier substrate 110 (shown below). The interposing substrate 106 may comprise, for example, bis-maleimide-triazine (BT), prepreg, or Ajinomoto build-up film (ABF-film) based dielectric layers. The interposing substrate 106 may be thin. In one embodiment, the interposing substrate 106 is less than about 400 μm, for example, between 50 μm to 250 μm. The carrier substrate 110 may comprise an organic substrate, such as a BT-based substrate. The carrier substrate 110 includes an array of contacts 112 disposed on the bottom surface to provide an interface to the semiconductor device 100 (e.g., a printed-circuit board (PCB) interface). For example, the contacts 112 may comprise solder balls forming a ball grid array (BGA) interface to a PCB. Alternatively, the contacts 112 may comprise pads forming a land grid array (LGA) interface to the PCB. In one embodiment, the semiconductor device 100 includes an optional lid 120.

Discrete components 114, 116, and 118 are disposed between the interposing substrate 106 and the carrier substrate 110 and mounted to the bottom surface of the interposing substrate 106 among the solder balls 108. Terminals of the discrete components 114, 116, and 118 are electrically coupled to conductive lands on the bottom surface of the interposing substrate 106 (shown below). In the illustrated embodiment, each discrete component 114, 116, and 118 is surface mounted (SMT) to corresponding conductive lands on the bottom surface of the interposing substrate 106 to form an electrical and a mechanical connection. Discrete components may also be disposed on the top surface of the interposing substrate (not shown).

For example, each discrete component 114, 116, and 118 may comprise a capacitor coupled to conductive lands on the interposer 106 that are in electrical communication power and ground bumps on the die 102 (e.g., decoupling capacitor or bypass capacitor). The discrete components 114, 116, and 118 may comprise capacitors employed for purposes other than decoupling, such as direct current (DC)-blocking and the like. In addition, the discrete components 114, 116, and 118 may include other types of SMT devices, such as resistors, inductors, and the like, or any combination of such devices and capacitors. As described below, the discrete components may also include various types of active components. Although three discrete components 114, 116, and 118 are shown, it is to be understood that any number of discrete components may be disposed between the interposing substrate 106 and the carrier substrate 110 in the manner shown.

Notably, the interposing substrate 106 may be smaller in X-Y extent than the carrier substrate 110. For example, for a 35 mm×35 mm body size package, the carrier substrate 110 may be 35 mm×35 mm and the interposing substrate 106 may be 33 mm×33 mm or smaller. A smaller sized interposing substrate 106 provides lower cost for implementing an effective package.

Figure 2:
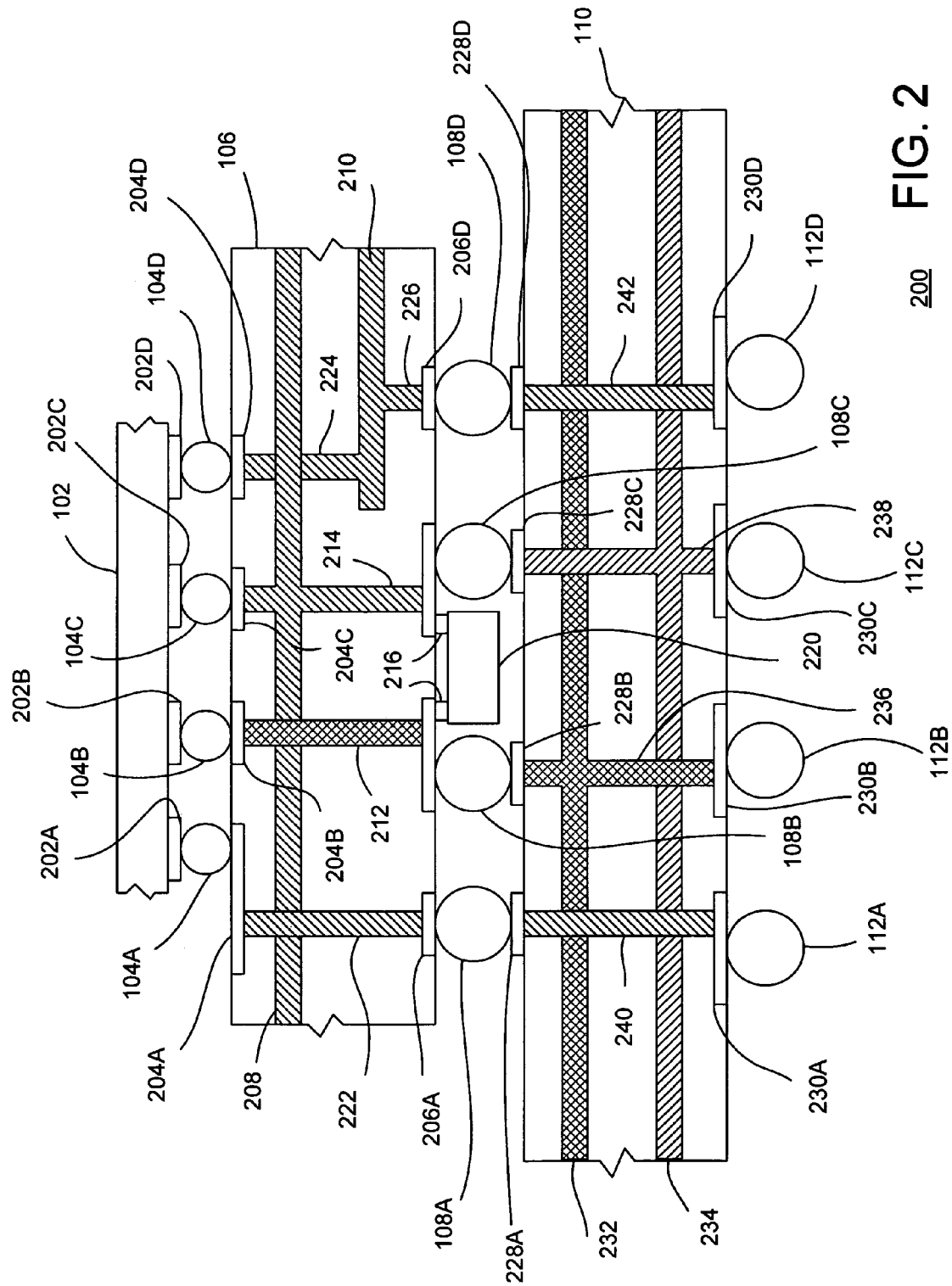
FIG. 2 is a more detailed cross-sectional view of a portion of the semiconductor device in accordance with one or more aspects of the invention.

FIG. 2 is a more detailed cross-sectional view of a portion 200 of the semiconductor device 100 in accordance with one or more aspects of the invention. Elements of FIG. 2 that are the same or similar to elements in FIG. 1 are designated with identical reference numerals. In the illustrated embodiment, the die 102 includes lands 202A, 202B, 202C, and 202D (collectively lands 202). The lands 202 are part of a layer of metal (e.g., copper, aluminum, gold, silver, nickel, tin, platinum, or a multilayer combination of such metals that has been laminated and/or plated on a surface of the die 102). The metal layer is patterned using known photolithography techniques to define the lands 202. The lands 202 may be in electrical communication with one or more circuit traces (not shown) or a plated-through hole, known as a via (not shown), as is well known in the art. The bump contacts 104 include bump contacts 104A, 104B, 104C, and 104D. The bump contacts 104A through 104D are electrically and mechanically coupled to the lands 202A through 202D, respectively.

The interposing substrate 106 includes conductive interconnect comprising a plurality of conductive layers and a plurality of vias connecting the conductive layers. The conductive interconnect includes at least a top surface layer defining lands 204A, 204B, 204C, and 204D (collectively lands 204), and a bottom surface layer defining lands 206A, 206B, 206C, and 206D (collectively lands 206). The conductive interconnect may also include one or more embedded conductive layers. In this illustrative embodiment, the interposing substrate 106 includes two embedded conductive layers for a total of four layers. Notably, the conductive interconnect includes layers 208 and 210.

The land 204B is electrically coupled to the land 206B through a via 212. Notably, the via 212 is not electrically connected to the layer 206 and may be isolated from the layer 206 using keep-outs, as is well known in the art. The land 204C is electrically coupled to the land 206C through a via 214. The via 214 is also in electrical communication with the layer 206. The bump contact 104B is a power contact, and the bump contact 104C is a ground contact. The layer 206 optionally may be a ground plane. The vias 212 and 214 extend between the top and bottom layers of the interposing substrate 106 substantially perpendicular thereto. That is, the vias 212 and 214 extend nearly straight down from the bump contacts 104B and 104C to the lands 206B and 206C, respectively. Generally, the conductive interconnect of the interposing substrate 106 includes a via array formation having interspersed (e.g., checkerboard-like) power and ground vias for one or more power supplies. The vias in the interposing substrate 106 may have a fine pitch, such as about 230 μm, although other pitches may be employed. Although it would be ideal to have all power and ground vias be straight-down, in practice, one or more of the vias may deviate from straight-down due to routing or design rule constraints.

The capacitor 220 includes a pair of terminals 216. The capacitor 220 is surface mounted to the interposing substrate 106 such that one of the terminals 216 is mechanically and electrically connected to the land 206B, and the other of the terminals 216 is mechanically and electrically connected to the land 206C. Thus, the capacitor 220 is a decoupling capacitor electrically connected across power and ground. The combination of a thin interposing substrate, with fine pitch vias, and with at least a portion of the vias being achieves low inductance in the interconnection path to the terminals 216 of the capacitor 220.

The bump contacts 104A and 104D are I/O signal bumps (as opposed to power or ground bumps). The land 204A is electrically coupled to the land 206A through a via 222. Notably, the via 222 is not electrically connected to the layer 206 and may be isolated from the layer 206 using keep-outs, as is well known in the art. The top layer in the conductive interconnect of the interposing structure 106 may provide signal routing. The land 204A is extended laterally such that I/O signals associated with the bump contact 104A are re-distributed laterally to the land 206A. That is, the bump contact 104A and the land 206A are laterally separated from one another. The land 204D is electrically coupled to the land 206D through vias 224 and 226. The vias 224 and 226 are in electrical communication with the layer 210. The layer 210 may comprise a signal routing layer. The vias 224 and 226 are laterally separated from one another and connected by the layer 210. The layer 210 re-distributes I/O signals associated with the bump contact 104D laterally to the land 206D. As is apparent from the above-description, the pitch of the bump contacts 104 may be less than the pitch of the lands 206, which requires lateral distribution of signals using, for example, the top layer and the layer 210 of the conductive interconnect in the interposing substrate 106.

The solder balls 108 include solder balls 108A, 108B, 108C, and 108D. The carrier substrate 110 includes conductive interconnect comprising a plurality of conductive layers and a plurality of vias connecting the conductive layers. The conductive interconnect includes at least a top surface layer defining lands 228A, 228B, 228C, and 228D (collectively lands 228), and a bottom surface layer defining lands 230A, 230B, 230C, and 230D (collectively lands 230). The conductive interconnect may also include one or more embedded conductive layers. In this illustrative embodiment, the carrier substrate 110 includes two embedded conductive layers for a total of four layers. Notably, the conductive interconnect includes layers 232 and 234. In one embodiment, the carrier substrate 110 can be adequately supported by plated through-hole (PTH) technology, rather than build-up technology, due to the generally low density routing needs. This enables a low cost and high yield multiple-unit strip format for the carrier substrate to be used, as discussed below with respect to FIGS. 11-13.

The land 228B is electrically coupled to the land 230B through a via 236. Notably, the via 236 is also in communication with the layer 232, but is isolated from the layer 234 (e.g., using keep-outs). The land 228C is electrically coupled to the land 230C through a via 238. The via 238 is also in electrical communication with the layer 234, but is isolated from the layer 232 (e.g., using keep-outs). In one embodiment, the layer 232 comprises a power plane, while the layer 234 comprises a ground plane. Alternatively, both layers 232 and 234 may be ground planes, or the layer 232 may be a ground plane and the layer 234 may be a power plane. The land 228A is electrically coupled to the land 230A through a via 240, and the land 228D is electrically coupled to the land 230D through a via 242. The vias 240 and 242 are electrically isolated from the layers 232 and 234. The solder balls 108A through 108D are electrically and mechanically coupled to the lands 230A through 230D, respectively. Contacts 112A through 112D (illustratively shown as solder balls) are mechanically and electrically coupled to the lands 230A through 230D.

The top and bottom conductive layers of the carrier substrate 110 may be used to re-distribute signals laterally. In one embodiment, the conductive interconnect of the interposing substrate 106 is used to perform most lateral re-distribution of signals. Thus, the conductive interconnect of the interposing substrate 106 provides lateral escape routing of I/O signals from the bump contacts of the die to their final pinout location or nearby their final pinout location in the composite package. Lateral re-distribution in the carrier substrate 110 may be limited to short jogs, for example, up to three pitches of the contacts 112. Alternatively, some lateral re-distribution may comprise longer routes. Longer routes do not necessarily degrade performance, as long as proper transmission line characteristics, such as impedance continuity and a skew/cross-talk control plane, are in place. For I/O signals or power/ground signals that have been escaped to the final location, a direct communication from the top to bottom of the carrier substrate 110 is sufficient. For those signals that do not reach their final location due to various reasons such as: 1) escape constraints on the interposing substrate 106; 2) power/ground pin cluster from the die that will rely on planes in the carrier substrate 110 for further spreading to the final pinout; 3) pins that are displaced due to the placement of the discrete components between the interposing structure 106 and the carrier substrate 110, redistribution in the carrier substrate 110 provides nearly direct communication from the top to bottom surface of the carrier substrate 110.

In the embodiment shown, the contacts 112 are disposed substantially straight-down from the solder balls 108 (i.e., the pinout patterns of the interposing substrate 106 and the carrier substrate 110 are substantially similar). As described above, the carrier substrate 110 may perform some lateral re-distribution. Thus, in another embodiment, the pinout patterns of the interposing substrate 106 and the carrier substrate 110 are different. Notably, at least one of the contacts 112 may be shadowed by a discrete circuit component mounted to the interposing substrate 106. By "shadowing" it is meant that the discrete component and the contact have the same X,Y location in the plane of the substrates 106 and 110.

Although a capacitor 220 has been shown, those skilled in the art will appreciate that other types of devices may be employed, such as resistors or inductors. In addition, as described below, active components may be encased between the interposing substrate 106 and the carrier substrate 110, such as memory, power regulator, voltage reference, integrated circuit, anti-resonance device/components, and the like. The encased components may be attached using various methods, such as surface mount, flip-chip mount, wire bond mount, and the like. In addition, although the capacitor 220 is shown having two terminals, it is to be understood that the capacitor 220 may have more than two terminals coupled to more than two lands on the interposing substrate 106.

For example, the die 102 may comprise a field programmable gate array (FPGA). In a typical FPGA configuration, the I/Os are organized by banks, with a typical bank size of 64 I/Os or 40 I/Os. For example, a state-of-the-art FPGA of die size 20 mm×16 mm includes 800 I/Os organized in 20 banks of 40 I/Os each. Each I/O bank occupies approximately a 1.5 mm×2.0 mm area on the die bump array. Within this bump array, there are 40 bumps for the I/Os, bumps for the ground net, and bumps for the I/O power, plus other power bumps such as auxiliary and core power. The I/O banks are tiled in a column or ring fashion tightly against one another. An I/O power decoupling capacitor directly matching the I/O bank bumps on the die may be mounted to the interposing substrate with a given clearance to the capacitor for the next bank. For example, the capacitor may have a size of 0.75 mm×1.5 mm or 0.5 mm×1.0 mm, leaving a 0.5 mm clearance for the capacitor for the next bank. In the above-described configuration, a total loop inductance of 50 pH to 80 pH can be achieved. For example, an 0603 8-terminal capacitor can provide an ESL of 45 pH, and a via array formation can achieve a 15 pH inductance. Thus, the total inductance is 60 pH. Thus, the invention exhibits a significant improvement (e.g., 2 to 10 times) over the prior art mechanisms for decoupling capacitors described above. Lower inductance is achievable by using even lower ESL capacitors and/or denser via array formation. For example, using an ultra-low ESL capacitor with a 3 pH inductance and coupling it with a 5 pH via array formation, the invention can achieve 8 pH total inductance.

Other power rails for the FPGA die, such as core and auxiliary power, exist in the I/O bank, but are more abundantly distributed all over the non-I/O region. The decoupling needs for such core and auxiliary power are more distributed in nature and can be more freely placed over the die area that is not associated with I/O. Note that other capacitors or discrete components can be placed anywhere else in the package extent, as long as the inductance to the signals or power being decoupled meets the design constraints. One example is for decoupling the power rails of multi-gigabit transceivers (MGTs) embedded in the FPGA die. Another example is for DC-blocking series capacitor for the signals for MGTs. Although an FPGA die has been described as an example, those skilled in the art will appreciate that the invention may be employed with other types if IC dies over various die sizes having various configurations for I/Os, power, and ground.

The thickness and profile of the encased discrete components affects the pitch of the solder balls 108. For example, a 0.55 mm thick capacitor profile could dictate a solder ball diameter of at least 0.55 mm, resulting in a safe (not causing ball-to-ball bridging during ball attach and reflow) minimum pitch of 0.8 mm. A 0.35 mm thick capacitor could allow for 0.4 mm diameter solder balls, and a minimum safe ball pitch of 0.6 mm. The minimum pitch of the solder balls 108 only needs to be enough so that all necessary communication between the interposing substrate 106 and the carrier substrate 110 is implemented. In some embodiments, the pitch of the solder balls 108 is different than the pitch of the solder balls 112 (although the pitches may be the same). The pitch of the solder balls 108 may be slightly finer than that of the solder balls 112 so that the displacement effect of the encased discrete components can be properly compensated.

Figure 3:
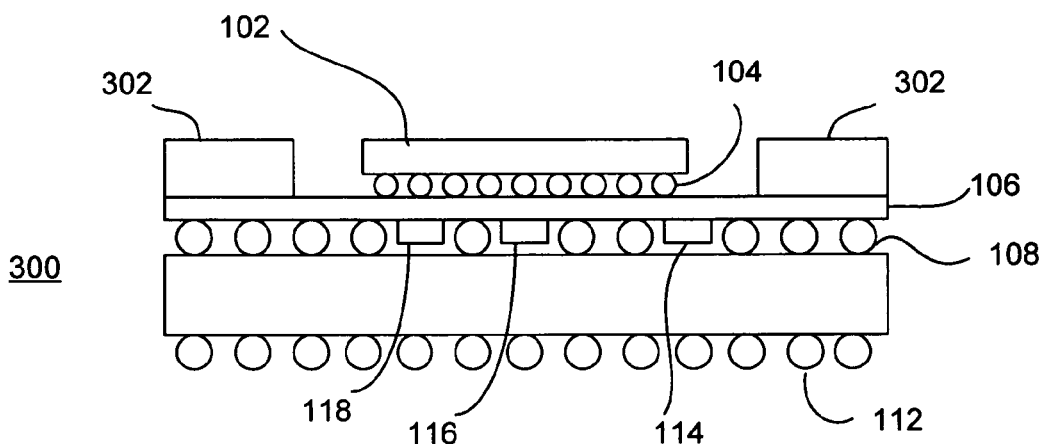
FIG. 3 is a cross-sectional view of another embodiment of a semiconductor device in accordance with one or more aspects of the invention.

FIG. 3 is a cross-sectional view of another embodiment of a semiconductor device 300 in accordance with one or more aspects of the invention. Elements of FIG. 3 that are the same or similar to those of FIG. 1 are designated with identical reference numerals and described in detail above. The semiconductor device 300 includes a stiffener 302 mounted to the top surface of the interposing substrate 106. The stiffener 302 is configured to provide support for the interposing substrate 106, which may be relatively thin, as described above.

Figure 4:
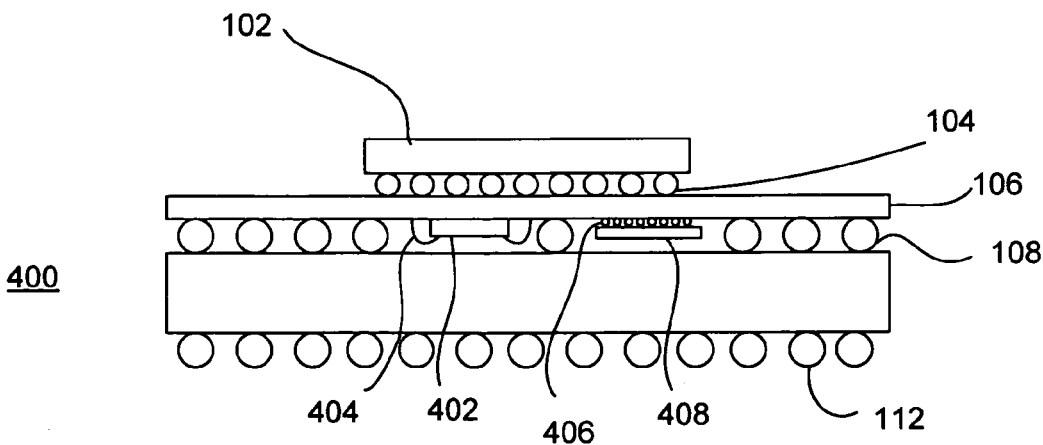
FIG. 4 is a cross-sectional view of another embodiment of a semiconductor device in accordance with one or more aspects of the invention.

FIG. 4 is a cross-sectional view of another embodiment of a semiconductor device 400 in accordance with one or more aspects of the invention. Elements of FIG. 4 that are the same or similar to those of FIG. 1 are designated with identical reference numerals and described in detail above. In the present embodiment, the encased components between the interposing substrate 106 and the carrier substrate 110 include an active component 402 and an active component 408. The active component 402 is wire bonded to lands on the interposing substrate 106 using wires 404. The active component 408 is flip-chip mounted to lands on the interposing substrate 106 using bump contacts 406. The active components 402 and 408 may comprise various types of active devices, such as memory, power regulators, voltage references, integrated circuits, anti-resonance devices/components, and the like.

In one embodiment, the encased components between the interposing substrate 106 and the carrier substrate 110, as well as the solder balls 108, may be encapsulated in an underfill. For example, epoxy material may be dispensed to fill the voids in the gap between the interposing substrate 106 and the carrier substrate 110 among the encased components and the solder balls 108. Underfill 410 is shown in FIG. 4, but can be employed in any configuration, including those of FIGS. 1 through 3. The underfill 410 can protect the encased components and provide for a more robust composite package against thermal, vibration, and shock stresses.

Figure 5:
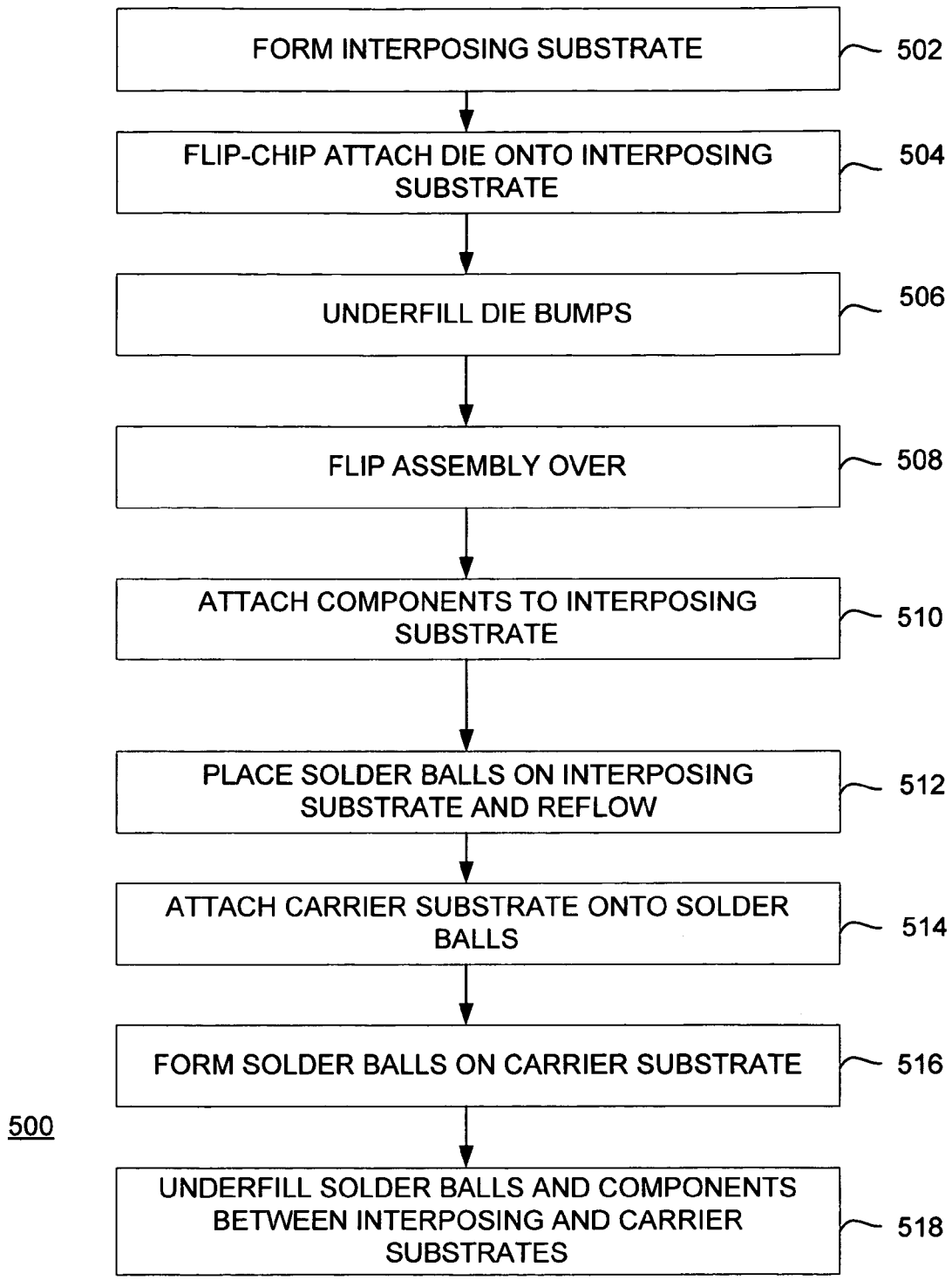
FIG. 5 is a flow diagram depicting an exemplary embodiment of a method for fabricating a composite flip-chip package in accordance with one or more aspects of the invention.
Figure 6:
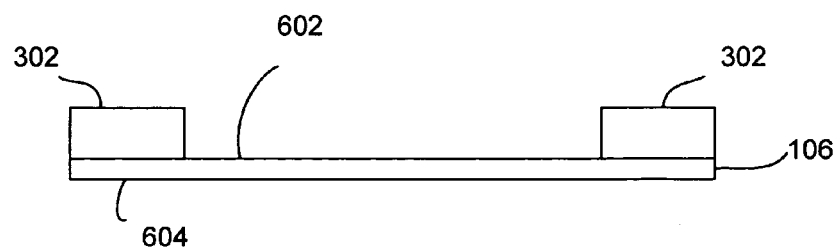
FIGS. 6-10 are cross-sectional views depicting stages of fabrication of a semiconductor device in accordance with one or more aspects of the invention.

FIG. 5 is a flow diagram depicting an exemplary embodiment of a method 500 for fabricating a composite flip-chip package in accordance with one or more aspects of the invention. The method 500 may be understood with respect to FIGS. 6-10. The method 500 begins at step 502, where the interposing substrate 106 is formed (FIG. 6). The interposing substrate may comprise BT, prepreg, or ABF-film and include conductive interconnect having a plurality of conductive layers patterned using known photolithography techniques and vias formed using ultraviolet (UV) or carbon dioxide ($CO_2$) laser drilling. For simplicity, the conductive interconnect in the interposing substrate 106 is not shown in FIG. 6. The stiffener 302 may be optionally attached to a top surface 602 the interposing substrate 106.

Figure 7:
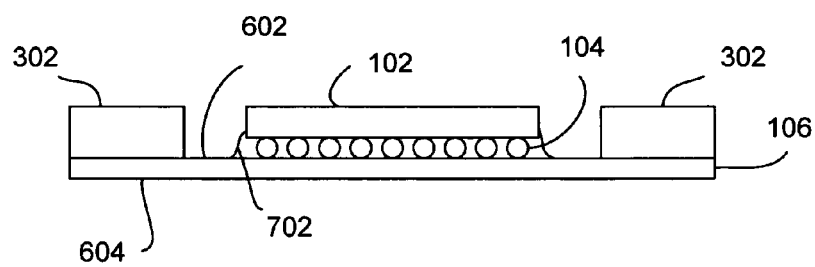

At step 504, the integrated circuit die 102 is flip-chip attached to the interposing substrate 106 (FIG. 7). The integrated circuit die 102 is attached to the top surface 602 of the interposing substrate 106 in electrical communication with the conductive interconnect of the interposing substrate 106. At step 506, the die bumps 104 may be encapsulated using underfill 702 (FIG. 7). At step 508, the assembly is flipped over so that a bottom surface 604 of the interposing substrate 106 is face up and can be processed.

Figure 8:
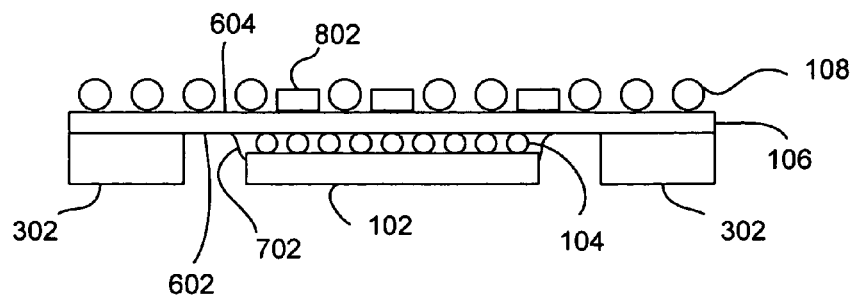
Figure 9:
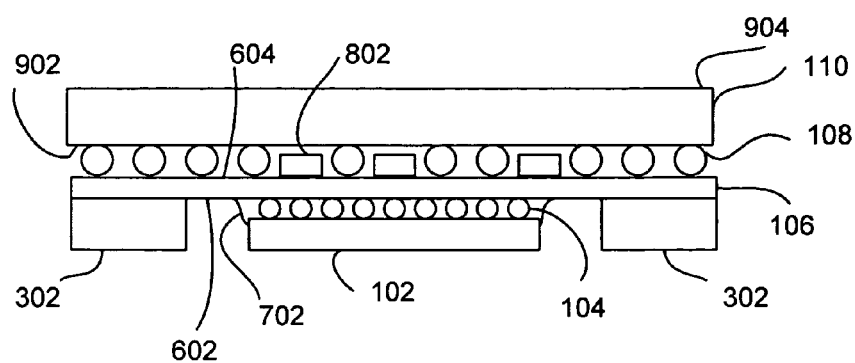
Figure 10:
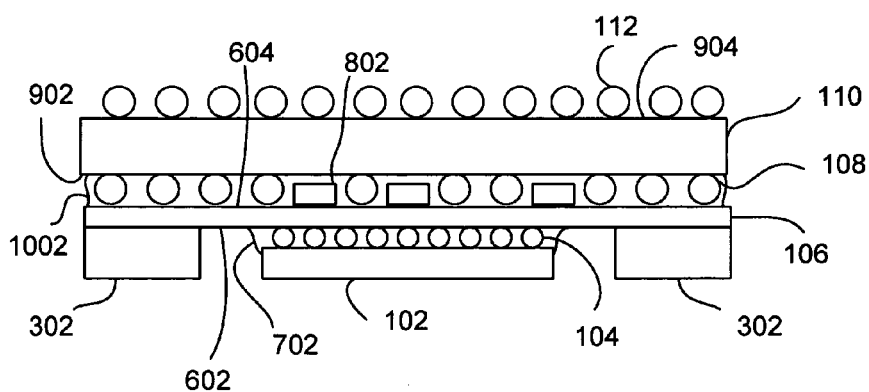

At step 510, discrete components 802 are attached to the interposing substrate 106 (FIG. 8). The discrete components 802 are attached to the bottom surface 604 of the interposing substrate 106 in electrical communication with the conductive interconnect thereof. The discrete components 802 may include capacitors, resistors, inductors, active components, or any combination thereof. At step 512, the solder balls 108 are placed on the interposing substrate 106 (FIG. 8). A reflow process is performed to mechanically and electrically attach the solder balls to the conductive interconnect of the interposing substrate 106. At step 514, the carrier substrate 110 is attached to the solder balls 108 (FIG. 9). A top surface 902 of the carrier substrate 110 is attached to the solder balls 108 such that the conductive interconnect of the carrier substrate 110 (not shown for simplicity) is in electrical communication with the solder balls 108. At step 516, the solder balls 112 are formed on the carrier substrate 110 (FIG. 10). The solder balls 112 are placed on a bottom surface 904 of the carrier substrate 110 in electrical communication with conductive interconnect of the carrier substrate 110. At step 518, the solder balls 108 and the discrete components between the interposing substrate 106 and the carrier substrate 110 are encapsulated using an underfill 1002 (FIG. 10).

Figure 11:
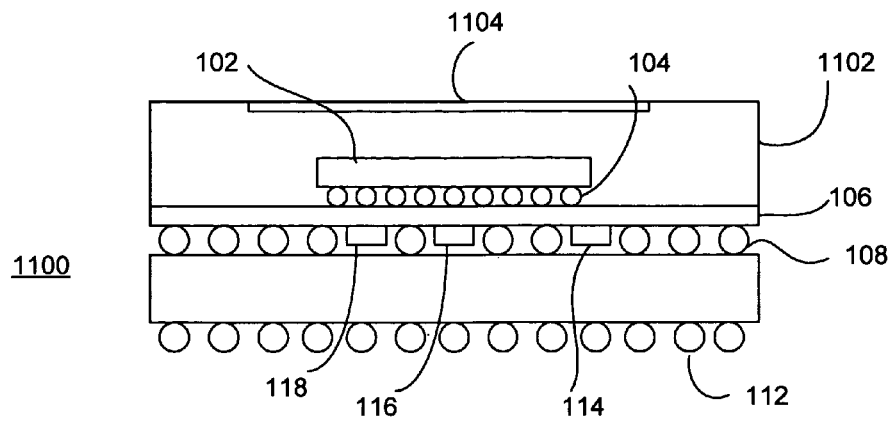
FIG. 11 is a cross-sectional view of another embodiment of a semiconductor device in accordance with one or more aspects of the invention.

FIG. 11 is a cross-sectional view of another embodiment of a semiconductor device 1100 in accordance with one or more aspects of the invention. The elements of FIG. 11 that are the same or similar to those of FIG. 1 are designated with identical reference numerals and described in detail above. In the present embodiment, the semiconductor device 1100 comprises a molded composite flip-chip package. The die 102, the interposing substrate 106, and the discrete components 114, 116, and 118 are encapsulated with a molding compound 1102. The molding compound 1102 may comprise, for example, Sumitomo FC502 or like materials that can fill small gaps between the die 102, the interposing substrate 106, and the discrete components, such as mold compounds having a filler size of less than 40 µm. In one embodiment, a heatsink 1104 is embedded within the molding compound 1102 above the die 102. The molding compound 1102 provides support for the interposing substrate 106, thus a stiffener is not required. In addition, the molding compound 1102 protects the die 102 and the encased components and provides for a more robust composite package against thermal, vibration, and shock stresses. Furthermore, as described below, several molded composite flip-chip packages may be fabricated using a strip carrier substrate.

Figure 13:
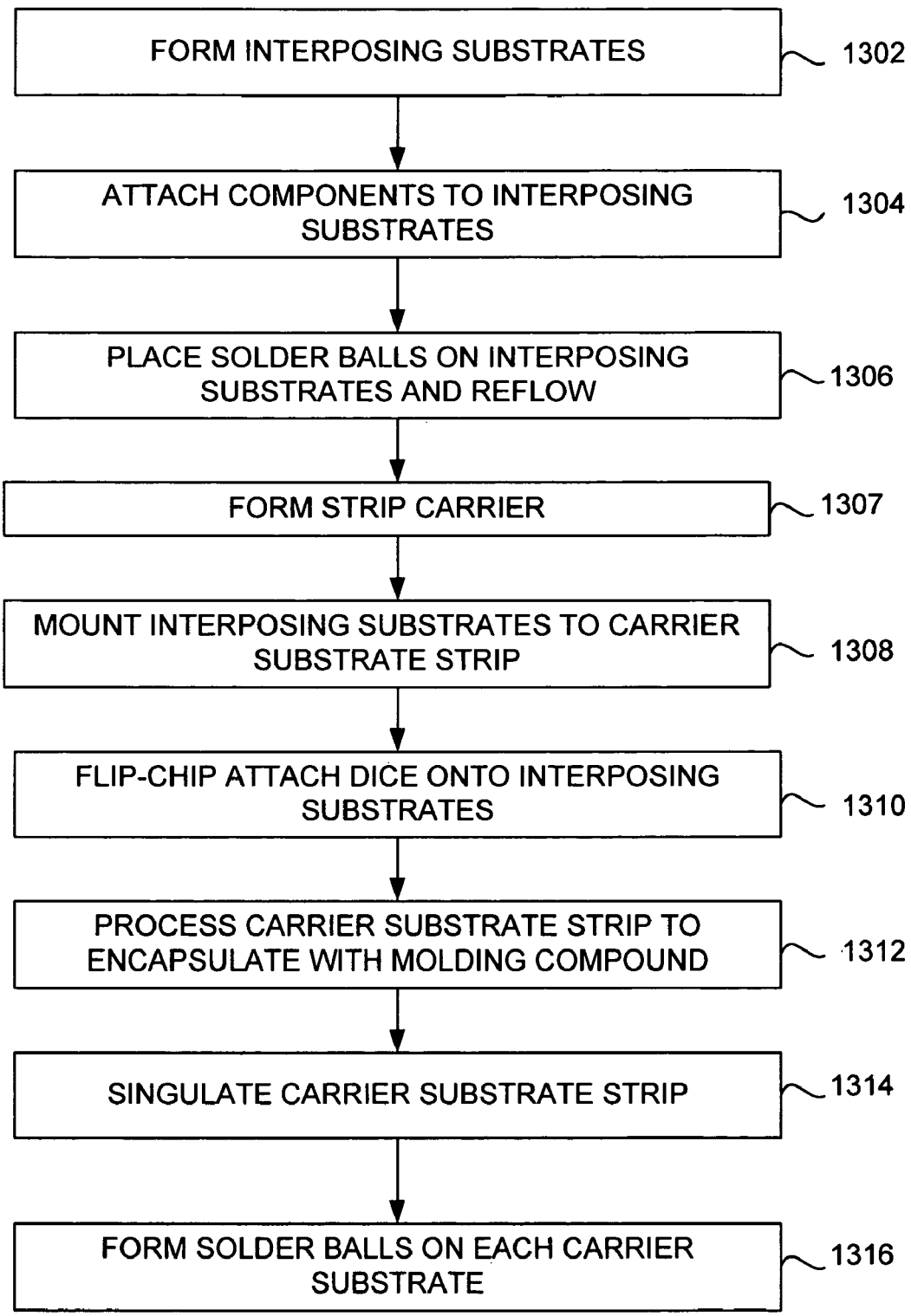
FIG. 13 is a flow diagram depicting an exemplary embodiment of a method of fabricating composite flip-chip packages in accordance with one or more aspects of the invention.

FIG. 13 is a flow diagram depicting an exemplary embodiment of a method 1300 of fabricating composite flip-chip packages in accordance with one or more aspects of the invention. The method 1300 begins at step 1302, where the interposing substrates are formed. The interposing substrates may be formed as described above in step 502 of FIG. 5. At step 1304, discrete components are attached to each of the interposing substrates. The discrete components may be attached to each interposing substrate as described above in step 510 of FIG. 5. At step 1306, solder balls are placed on the interposing substrates. A reflow process is performed to mechanically and electrically attach the solder balls to the conductive interconnect of the interposing substrates.

Figure 12:
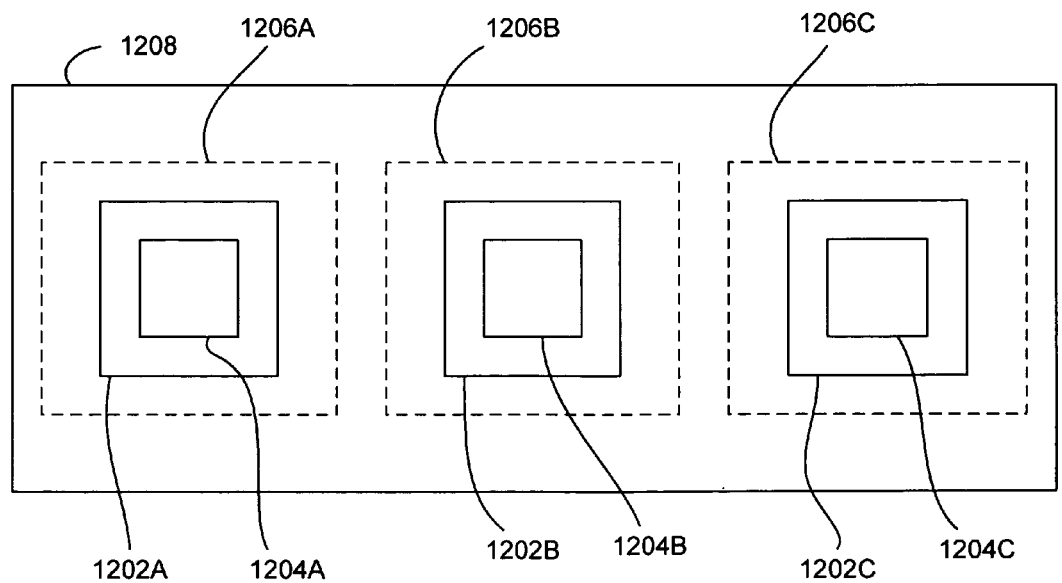
FIG. 12 is a plan view of an exemplary embodiment of a strip carrier in accordance with one or more aspects of the invention.

At step 1307, a strip carrier is formed. FIG. 12 is a plan view of an exemplary embodiment of a strip carrier 1200 in accordance with one or more aspects of the invention. In one embodiment, the strip carrier 1200 comprises a natively integrated strip having functional substrate areas (denoted by outlines 1206A through 1206C) and a carrier frame area 1208. Each functional substrate area comprises a carrier substrate configured to support and communication with an interposing substrate. In another embodiment, the carrier frame 1208 includes mounting sites (denoted by the outlines 1206). Individual carrier substrates are mounted in the mounting sites (e.g., multiple of the carrier substrate 110). That is, the carrier frame 1208 is formed having mounting sites, carrier substrates are individually formed, and the carrier substrates are inserted into the matching mounting sites on the carrier frame 1208.

At step 1308, the interposing substrates are mounted to a strip carrier. In one embodiment, the interposing substrates are mounted to carrier substrate areas of an integrated strip carrier. Alternatively, the interposing substrates may be mounted to the single carrier substrates mounted to the carrier frame 1208 of the strip carrier 1200. The illustrative strip carrier 1200 includes interposing substrates 1202A, 1202B, and 1202C. Although only three substrates 1202 are shown, a strip carrier may generally include a plurality of substrates 1202.

At step 1310, a die is flip-chip attached onto each of the interposing substrates. In FIG. 12, the interposing substrates 1202A through 1202C includes dice 1204A through 1204C, respectively, mounted thereon. At step 1312, the strip carrier is processed to encapsulate the interposing substrates and dice with molding compound. In FIG. 12, the outlines 1206 may correspond to molding outlines. At step 1314, the strip carrier is singulated to produce a plurality of composite flip-chip packages. At step 1316, contacts are formed on each carrier substrate (e.g., solder balls or pads). In this manner, molded flip-chip packages may be fabricated on a strip level for higher throughput volume.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. An assembly configured for mounting on a printed circuit board (PCB), comprising:
an integrated circuit die having an array of bump contacts;
a carrier substrate having an array of contacts on a bottom surface thereof for providing an interface to the PCB;
an array of solder balls disposed on a top surface of the carrier substrate;
an interposing substrate disposed between the integrated circuit die and the carrier substrate and having a top surface mounted to the array of bump contacts and a bottom surface mounted to the array of solder balls;
at least one discrete circuit component disposed between the interposing substrate and the carrier substrate, each of the at least one discrete component being mounted to the bottom surface of the interposing substrate among the array of solder balls without contacting the carrier substrate; and
a molding compound encapsulating the integrated circuit die, the interposing substrate, and the at least one discrete circuit component.

2. The assembly of claim 1, wherein the discrete circuit component shadows a contact in the array of contacts.

3. The assembly of claim 1, wherein the array of contacts comprises an array of solder balls in a ball grid array (BGA) formation or an array of pads in a land grid array (LGA) formation.

4. The assembly of claim 1, further comprising:
a heat sink embedded within the molding compound.

5. The assembly of claim 1, wherein each of the at least one discrete component comprises one of a resister, a capacitor, an inductor, and an active device, and wherein the discrete component is mounted to the bottom surface via one of a surface mount, flip-chip mount, or wire bond mount.

6. An assembly, comprising:
a carrier strip configured to support a plurality of flip-chip assemblies configured for mounting on a printed circuit board (PCB), the carrier strip having contacts on a bottom surface thereof;

interposing substrates, each of the interposing substrates having an array of solder balls disposed on the bottom surface thereof mounted to a top surface of the carrier strip;

at least one discrete component disposed between each of the interposing substrates and the carrier strip, each of the at least one discrete component mounted to the bottom surface of a corresponding one of the interposing substrates without contacting the carrier strip;

integrated circuit dice, each of the integrated circuit dice having an array of bump contacts mounted to a top surface of a respective one of the interposing substrates; and molding compound encapsulating the integrated circuit dice and the interposing substrates to define flip-chip assemblies.

7. The assembly of claim 6, wherein the carrier strip comprises an integrated strip having carrier substrate areas and a carrier frame area, and wherein the interposing substrates are respectively mounted to the carrier substrate areas.

8. The assembly of claim 6, wherein the carrier strip comprises a carrier frame having mounting sites with individual carrier substrates mounted therein, and wherein the interposing substrates are respectively mounted to the carrier substrates.

9. The assembly of claim 6, further comprising:
heat sinks embedded in the molding compound for each of the flip-chip assemblies, respectively.

10. The assembly of claim 6, wherein, for each of the interposing substrates, each of the at least one discrete component comprises one of a resister, a capacitor, an inductor, and an active device.

11. The assembly of claim 6, wherein, for each of the interposing substrates, each of the at least one discrete component is mounted to the bottom surface via one of a surface mount, flip-chip mount, or wire bond mount.

* * * * *